US012563849B2

(12) United States Patent　(10) Patent No.:　US 12,563,849 B2
Park et al.　(45) Date of Patent:　Feb. 24, 2026

(54) IMAGE SENSOR FOR A CAMERA DEVICE

(71) Applicant: SAMSUNG ELECTRONICS CO., LTD., Suwon-si (KR)

(72) Inventors: Hyeyeon Park, Seoul (KR); Yunki Lee, Hwaseong-si (KR); Jinwoong Namgoong, Seoul (KR); Hyunseok Song, Suwon-si (KR); Hyungkeun Gweon, Seongnam-si (KR); Bumsuk Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 753 days.

(21) Appl. No.: 17/746,042

(22) Filed: May 17, 2022

(65) Prior Publication Data

US 2023/0017043 A1　Jan. 19, 2023

(30) Foreign Application Priority Data

Jul. 9, 2021　(KR) ........................ 10-2021-0090428
Sep. 3, 2021　(KR) ........................ 10-2021-0117306

(51) Int. Cl.
　*H10F 39/00*　　(2025.01)
　*G02B 3/00*　　(2006.01)
　*G02B 5/20*　　(2006.01)
　*H01L 25/16*　　(2023.01)
　*H10F 39/18*　　(2025.01)
　　　(Continued)

(52) U.S. Cl.
　CPC ....... *H10F 39/8053* (2025.01); *G02B 3/0006* (2013.01); *G02B 3/0056* (2013.01); *G02B 5/201* (2013.01); *H01L 25/167* (2013.01); *H10F 39/024* (2025.01); *H10F 39/8063* (2025.01); *H10F 39/809* (2025.01);
　　　(Continued)

(58) Field of Classification Search
　CPC ............. H10F 39/8053; H10F 39/8063; H10F 39/809; H10F 55/155; H10F 77/40; H10F 39/024; G02B 3/0056; G02B 5/201; G02B 3/0006; H01L 25/167; H10H 20/855
　See application file for complete search history.

(56) References Cited

U.S. PATENT DOCUMENTS 8,049,805 B2　11/2011　Fukuyoshi et al.
9,450,005 B2 *　9/2016　Yanagita ............... H10F 39/811
　　　(Continued)

FOREIGN PATENT DOCUMENTS

KR　10-2017-0008785 A　1/2017
KR　10-2020-0145978 A　12/2020
　　　(Continued)

OTHER PUBLICATIONS

Communication dated Jul. 22, 2025, issued by the Korean Patent Office in Korean Application No. 10-2021-0117306.

*Primary Examiner* — Alonzo Chambliss
(74) *Attorney, Agent, or Firm* — Sughrue Mion, PLLC

(57) ABSTRACT

Provided is an image sensor including a light sensing element, a planarization layer disposed on the light sensing element, a color filter array layer disposed on the planarization layer, the color filter array layer including color filters, and a microlens disposed on the color filter array layer, wherein the color filters include a green filter, a blue filter and a red filter, and wherein a refractive index of the green filter is greater than 1.7 for a green light wavelength range of 500 nm to 570 nm.

17 Claims, 14 Drawing Sheets

(51) Int. Cl.
  H10F 55/155 (2025.01)
  H10F 77/40 (2025.01)
  H10H 20/855 (2025.01)

(52) U.S. Cl.
  CPC ........... H10F 55/155 (2025.01); H10F 77/40 (2025.01); H10H 20/855 (2025.01); *H10F 39/182* (2025.01)

(56) References Cited

U.S. PATENT DOCUMENTS

| | | | | |
|---|---|---|---|---|
| 9,564,462 | B2* | 2/2017 | Hsu | H10F 39/182 |
| 9,634,058 | B2 | 4/2017 | Miyashita | |
| 10,840,302 | B2 | 11/2020 | Han et al. | |
| 10,991,736 | B2 | 4/2021 | Takahashi et al. | |
| 11,417,699 | B2 | 8/2022 | Lee et al. | |
| 11,581,347 | B2 | 2/2023 | Kim et al. | |
| 2012/0104525 | A1* | 5/2012 | Wu | G02B 3/0018 |
| | | | | 257/E31.127 |
| 2013/0134537 | A1* | 5/2013 | Nakajiki | G02B 5/201 |
| | | | | 252/589 |
| 2015/0287756 | A1* | 10/2015 | Ezoe | H10F 39/8067 |
| | | | | 257/432 |
| 2018/0315791 | A1 | 11/2018 | Hsieh et al. | |
| 2021/0088439 | A1 | 3/2021 | Cho | |
| 2021/0104565 | A1 | 4/2021 | Yang | |
| 2021/0118929 | A1 | 4/2021 | Yang et al. | |
| 2021/0118932 | A1 | 4/2021 | Cho et al. | |

FOREIGN PATENT DOCUMENTS

| | | | |
|---|---|---|---|
| KR | 10-2021-0022306 | A | 3/2021 |
| WO | 2016/031444 | A1 | 3/2016 |

* cited by examiner

| R | G | R | G |
|---|---|---|---|
| G | B | G | B |
| R | G | R | G |
| G | B | G | B |

| W | G | W | G |
|---|---|---|---|
| G | W | R | W |
| W | B | W | G |
| B | W | G | W |

| W | G | W | G |
|---|---|---|---|
| R | W | B | W |
| W | G | W | G |
| B | W | R | W |

IMAGE SENSOR FOR A CAMERA DEVICE

CROSS-REFERENCE TO RELATED APPLICATION

This application claims priority to Korean Patent Application Nos. 10-2021-0090428 and 10-2021-0117306, filed on Jul. 9, 2021 and Sep. 3, 2021, respectively, in the Korean Intellectual Property Office, the disclosures of which are incorporated herein by reference in their entireties.

BACKGROUND

1. Field

Example embodiments relate to an image sensor, a camera device including the image sensor, an electronic device including the camera device, and a method of manufacturing the image sensor.

2. Description of Related Art

As the number of pixels increases in order to increase the resolution of an image sensor, the area of each pixel decreases so that the effective pixel area may decrease. Thus, it is needed to increase the concentration efficiency of incident light onto a photodiode included in each pixel.

SUMMARY

One or more example embodiments provide an image sensor having improved characteristics.

One or more example embodiments also provide a camera device including the image sensor having improved characteristics.

One or more example embodiments also provide an electronic device including the camera device having improved characteristics.

One or more example embodiments also provide a method of manufacturing an image sensor having improved characteristics.

According to an aspect of an example embodiment, there is provided an image sensor including a light sensing element disposed in a substrate, a planarization layer disposed on the light sensing element, a color filter array layer disposed on the planarization layer, the color filter array layer including color filters, and a microlens disposed on the color filter array layer, wherein the color filters include a green filter, a blue filter and a red filter, and wherein a refractive index of the green filter is greater than 1.7 for a green light wavelength range of 500 nm to 570 nm.

According to another aspect of an example embodiment, there is provided an image sensor including a light sensing element disposed in a substrate, a planarization layer disposed on the light sensing element, a color filter array layer disposed on the planarization layer, the color filter array layer including color filters, and a microlens on the color filter array layer, wherein the color filters include a green filter, a blue filter and a red filter, and wherein the green filter includes a green pigment having a weight ratio of 35 wt % to 50 wt %.

According to another aspect of an example embodiment, there is provided an image sensor including a light sensing element, a planarization layer disposed on the light sensing element, a color filter array layer disposed on the planarization layer, the color filter array layer including color filters, and a microlens on the color filter array layer, wherein the color filters include a green filter, a blue filter and a red filter, and wherein a refractive index of the green filter for a green light wavelength range is greater than a refractive index of the microlens, a refractive index of the blue filter for a blue light wavelength range is greater than the refractive index of the microlens, and a refractive index of the red filter for a red light wavelength range is greater than the refractive index of the microlens.

According to another aspect of an example embodiment, there is provided an image sensor including a first substrate, a first insulating interlayer disposed on the first substrate, the first insulating interlayer including first wirings, a second insulating interlayer disposed on the first insulating interlayer, the second insulating interlayer including second wirings, a second substrate disposed on the second insulating interlayer, a pixel division pattern included in the second substrate, the pixel division pattern forming a unit pixel region in which each unit pixel is formed, a light sensing element disposed in each unit pixel region, a transfer gate (TG) extending through a lower portion of the second substrate, the TG contacting the light sensing element, a floating diffusion (FD) region disposed at a lower portion of the second substrate adjacent to the TG, a lower planarization layer disposed on the second substrate, a color filter array layer disposed on the lower planarization layer, the color filter array layer including color filters, an interference blocking structure disposed between the color filters, a microlens on the color filter array layer, a transparent protection layer disposed on the microlens, a pad extending through the lower planarization layer and an upper portion of the second substrate, and a first through via structure extending through the lower planarization layer, the second substrate, the second insulating interlayer, and an upper portion of the first insulating interlayer, the first through via commonly contacting the first wirings and the second wirings, wherein the color filters include a green filter, a blue filter and a red filter, and wherein a refractive index of the green filter is greater than 1.7 for a green light wavelength range of 500 nm to 570 nm.

According to another aspect of an example embodiment, there is provided a camera device including a prism configured to change a path of a light incident from an outside by reflecting the incident light, an optical path folding element (OPFE) configured to change an optical zoom ratio of the reflected light from the prism, an image sensing device configured to sense an image of an object based on the light incident from the OPFE, and a storage device configured to store image data generated from the image sensing device, wherein the image sensing device includes a light sensing element disposed on a substrate, a planarization layer disposed on the light sensing element, a color filter array layer disposed on the planarization layer, the color filter array layer including color filters, and a microlens on the color filter array layer, wherein the color filters include a green filter, a blue filter and a red filter, and wherein a refractive index of the green filter is greater than or equal to 1.7 for a green light wavelength range of 500 nm to 570 nm.

According to another aspect of an example embodiment, there is provided an electronic device including a camera device configured to sense an object to generate image data, application processor (AP) configured to receive and process the image data generated from the camera, a power management integrated circuit (PMIC) configured to provide a power supply voltage to the camera, and an external memory configured to store the image data processed by the AP, wherein the camera device includes an image sensing device configured to sense an image of an object based on a light reflected from the object, wherein the image sensing device includes a light sensing element disposed on a substrate, a planarization layer disposed on the light sensing element, a color filter array layer on the planarization layer, the color filter array layer including color filters, and a microlens disposed on the color filter array layer, wherein the color filters include a green filter, a blue filter and a red filter, and wherein a refractive index of the green filter is greater than 1.7 for a green light wavelength range of 500 nm to 570 nm.

According to another aspect of an example embodiment, there is provided a method of manufacturing an image sensor, the method including forming a light sensing element in a substrate, forming a planarization layer on the light sensing element, forming a color filter array layer on the planarization layer, the color filter array layer including color filters, and forming a microlens on the color filter array layer, wherein forming each of the color filters includes forming a composition by mixing a pigment, a pigment dispersant, a binder resin and a solvent; and depositing the composition on the planarization layer, wherein the color filters include a green filter, a blue filter and a red filter, and wherein a refractive index of the green filter is greater than 1.7 for a green light wavelength range.

According to another aspect of an example embodiment, there is provided a method of manufacturing an image sensor, the method including forming a light sensing element in a substrate, forming a planarization layer on the light sensing element, forming a color filter array layer on the planarization layer, the color filter array layer including color filters, and forming a microlens on the color filter array layer, wherein forming each of the color filters includes forming a composition by mixing a pigment, a pigment dispersant, a binder resin and a solvent, and depositing the composition on the planarization layer, wherein the color filters include a green filter, a blue filter and a red filter, and wherein the composition for the green filter includes a green pigment having a weight ratio of 35 wt % to 50 wt %. Each pixel included in the image sensor in accordance with example embodiments may include the color filters having the relatively high refractive indices and the relatively high absorbances, and thus each pixel may have enhanced light condensation efficiency and a reduced beam spot size generated by an incident light. Accordingly, the image sensor may have an increased effective pixel area, and each of the color filters may have desired spectrum characteristics even with a small thickness. As each of the color filters has the relatively small thickness, the focus of the incident light may be adjusted to be adjacent to the light sensing element, and thus each pixel may have enhanced sensitivity.

BRIEF DESCRIPTION OF THE DRAWINGS

The above and/or other aspects will be more apparent by describing example embodiments, taken in conjunction with the accompanying drawings, in which:

FIG. 5 is a cross-sectional view illustrating an image sensor according to example embodiments;

FIGS. 6, 7, 8, 9, 10, 11, and 12 are cross-sectional views illustrating a method of manufacturing an image sensor according to example embodiments;

FIG. 13 is a cross-sectional view illustrating an image sensor according to example embodiments;

DESCRIPTION OF EMBODIMENTS

Image sensors, camera modules including the image sensors, electronic devices including the camera modules, and methods of manufacturing the image sensors in accordance with example embodiments will be more clearly understood from the following detailed description taken in conjunction with the accompanying drawings.

It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

Figure 1:
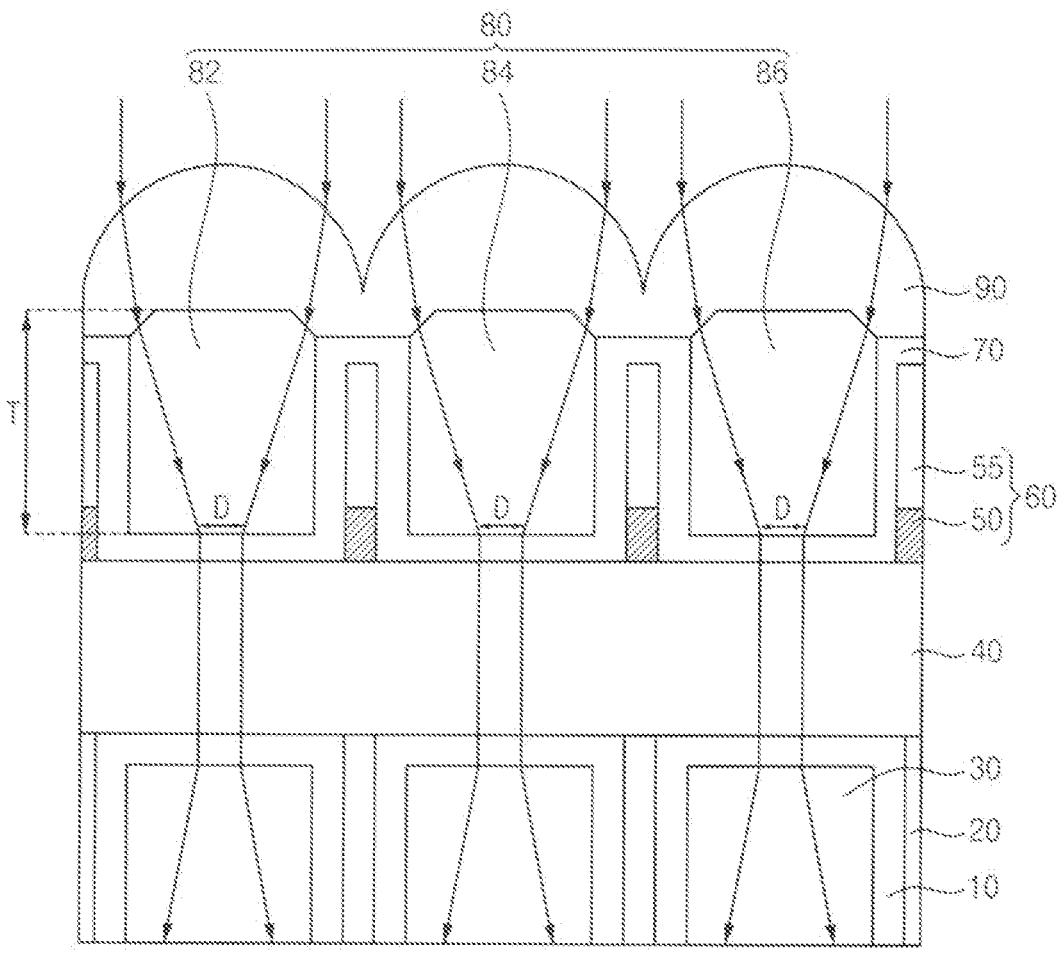
FIG. 1 is a cross-sectional view illustrating structures of pixels included in an image sensor in accordance to example embodiments.
Figure 2:
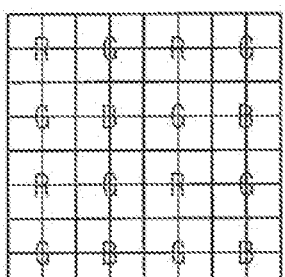
FIGS. 2 and 3 illustrate arrangements of color filters included in the image sensor.
Figure 3:
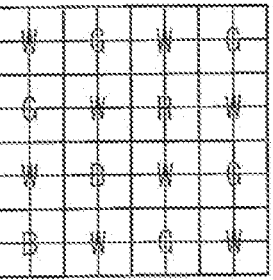
Figure 3:
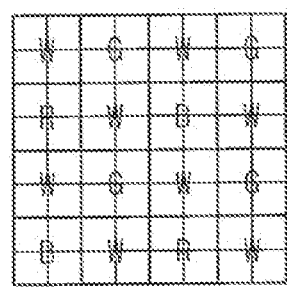
Figure 4:
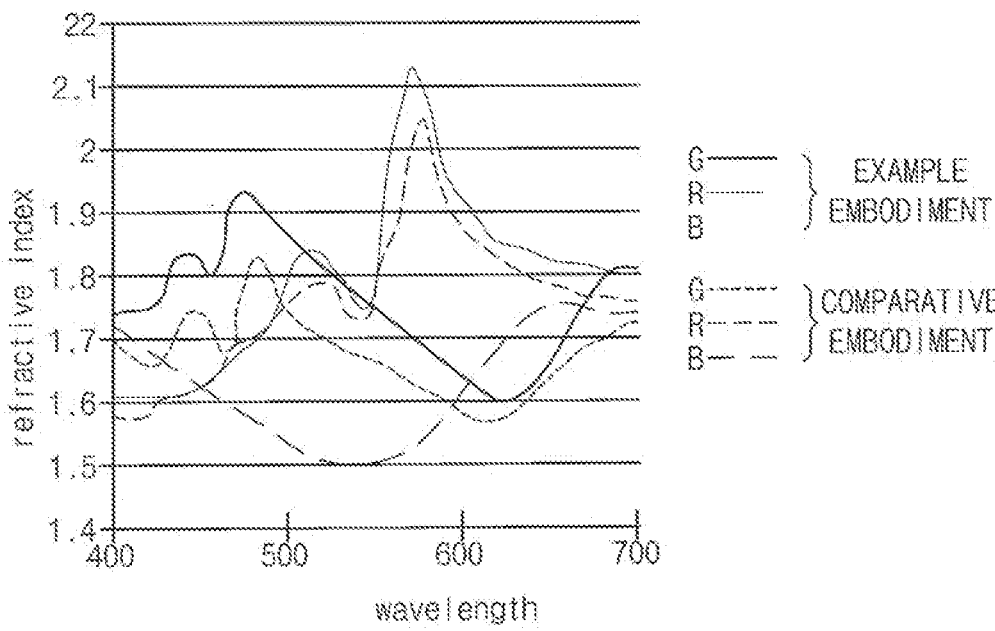
FIG. 4 is a graph illustrating refractive indices of the color filters in each pixel according to wavelengths of incident lights.

FIG. 1 is a cross-sectional view illustrating structures of pixels included in an image sensor according to example embodiments, FIGS. 2 and 3 illustrate arrangements of color filters included in the image sensor, and FIG. 4 is a graph illustrating refractive indices of the color filters in each pixel according to wavelengths of incident lights.

Referring to FIG. 1, each pixel may include a light sensing element 30 included in a substrate 10, a planarization layer 40 disposed on the substrate 10, a color filter array layer 80 disposed on the planarization layer 40, and a microlens 90 disposed on the color filter array layer 80.

A transparent protection layer may be further formed on the microlens 90.

In example embodiments, the substrate 10 may include silicon, germanium, silicon-germanium, or a III-V group compound semiconductor, such as gallium phosphide (GaP), gallium arsenide (GaAs), or gallium antimonide (GaSb). In example embodiments, a p-type well doped with p-type impurities may be formed partially or entirely in the substrate 10.

In example embodiments, the light sensing element 30 may be a portion of a photodiode (PD). For example, the light sensing element 30 may be an n-type impurity region in the p-type well in the substrate 10, and the n-type impurity region and the p-type well may form the photodiode.

In example embodiments, a pixel division pattern 20 may be formed in the substrate 10, and the light sensing element 30 included in each pixel may be formed in each region of the substrate 10 divided by the pixel division pattern 20. FIG. 1 shows one light sensing element 30 is formed in each region, however, embodiments are not limited thereto, and a plurality of light sensing elements 30 may be formed in each region.

In example embodiments, the pixel division pattern 20 may have a lattice shape in a plan view, and a unit pixel region in which each unit pixel may be formed may be defined in the substrate 10 by the pixel division pattern 20.

In example embodiments, a plurality of unit pixel regions may be arranged in first and second directions substantially parallel to an upper surface of the substrate 10 and crossing each other.

In example embodiments, the pixel division pattern 20 may include an insulating material, e.g., oxide or nitride, or a semiconductor material, e.g., polysilicon. According to another example embodiment, the pixel division pattern 20 may include a conductive material, e.g., doped polysilicon, metal, metal nitride, etc.

The planarization layer 40 may be formed on the substrate 10, and may include a single layer or multi-layers stacked in a vertical direction substantially perpendicular to the upper surface of the substrate 10. In example embodiments, the planarization layer 40 may include first to fifth layers sequentially stacked in the vertical direction, and may include, e.g., aluminum oxide, hafnium oxide, silicon oxide, silicon nitride and hafnium oxide, respectively.

The color filter array layer 80 may include a plurality of color filters divided from each other by an interference blocking structure 60 that may correspond to the pixel division pattern 20 in the vertical direction. For example, FIG. 1 shows a first color filter 82, a second color filter 84, and a third color filter 86. The first to third color filters 82, 84, and 86 may be arranged in each of the first and second directions on the planarization layer 40. In example embodiments, the first, second, and third color filters 82, 84, and 86 may be a green filter, a blue filter and a red filter, respectively. However, embodiments are not limited thereto.

The interference blocking structure 60 may serve as a barrier that may block a light incident onto one pixel from moving to a neighboring pixel, so that light interference between neighboring pixels may be prevented.

Referring to FIG. 2, in an example embodiment, the first color filter G, the second color filter B, and the third color filter R may be arranged in a Bayer pattern. One of the first to third color filters G, B, and R that may filter different colors from each other may be arranged in each pixel, or in each of a plurality of pixels.

In the latter case, neighboring color filters that may filter the same color may form a color filter group. For example, the first color filters G filtering a green light may be disposed adjacent to each other to form a first color filter group, the second color filters B filtering a blue light may be disposed adjacent to each other to form a second color filter group, and the third color filters R filtering a red light may be disposed adjacent to each other to form a third color filter group.

FIG. 2 shows four neighboring color filters filtering the same color form one color filter group, however, embodiments are not be limited thereto. For example, nine neighboring color filter, sixteen color filters, etc., may form one color filter group.

Referring to FIG. 3, in other example embodiments, the color filter array layer 80 may further include a fourth color filter W that may filter white color, and the first to fourth color filters G, B, R, and W may be arranged in the first and second directions by various types of arrangements.

FIG. 3 shows two types of arrangements of the first to fourth color filters G, B, R and W, however, embodiments are not limited thereto. As illustrated with reference to FIG. 2, one of the first to fourth color filters G, B, R, and W that may filter different colors from each other may be arranged in each pixel, or in each of a plurality of pixels, which may form a corresponding color filter group.

In example embodiments, the interference blocking structure 60 may include first and second interference blocking patterns 50 and 55 stacked in the vertical direction. The first interference blocking pattern 50 may include a metal having a low light absorption rate, e.g., tungsten, and the second interference blocking pattern 55 may include a relatively low refractive index material (LRIM), e.g., silicon oxide.

According to another example embodiment, the interference blocking structure 60 may include only a transparent material having a relatively low refractive index, and in this case, the interference blocking structure 60 may have a high reflective index.

In an example embodiment, a height of the interference blocking structure 60 may be lower than heights of the first to third color filters 82, 84, and 86. For example, most portion of a sidewall of each of the first to third color filters 82, 84, and 86 may be surrounded by the interference blocking structure 60 provided adjacent to the first to third color filters 82, 84, and 86, however, an upper portion of each of the first to third color filters 82, 84, and 86 may protrude upwardly from the interference blocking structure 60.

A protection layer 70 may be further formed on an upper surface and a sidewall of the interference blocking structure 60 and an upper surface of the planarization layer 40. Thus, a lower surface and a sidewall of each of the first to third color filters 82, 84, and 86 may be covered by the protection layer 70. The protection layer 70 may include a metal oxide, e.g., aluminum oxide.

A plurality of microlenses 90 may be formed on the color filter array layer 80 and the protection layer 70, and may condense light incident onto each pixel. In example embodiments, each of the microlenses 90 may be disposed on a corresponding one of the color filters 82, 84, and 86 included in each pixel. According to another example embodiment, each of the microlenses 90 may be commonly disposed on corresponding ones of the color filters 82, 84, and 86 included in neighboring pixels, respectively, e.g., ones of the color filters 82, 84, and 86 that may filter the same color.

Referring to FIG. 4, each of the green filter G, the red filter R and the blue filter B in accordance with example embodiments may have a refractive index (n) higher than that of corresponding green filter G, red filter R and blue filter B in comparative embodiment.

For example, the green filter G, the blue filter B, and the red filter R in comparative embodiment has refractive indices of about 1.676, 1.63, and 1.81, respectively, at a green light wavelength of about 540 nm, a blue light wavelength of about 450 nm, and a red light wavelength of about 630 nm, respectively. The green filter G, the blue filter B, and the red filter R in example embodiments has refractive indices of about 1.774, 1.669, and 1.847, respectively, at the green light wavelength of about 540 nm, the blue light wavelength of about 450 nm, and the red light wavelength of about 630 nm, respectively.

Thus, the green filter G in example embodiments may have a value of more than about 1.7 at a green light wavelength of about 500 nm to about 570 nm, and the red filter R in example embodiments may have a value of more than or equal to about 1.8 at a red light wavelength of about 610 nm to about 700 nm.

In example embodiments, each of the first to third color filters 82, 84, and 86 may have a refractive index greater than that of the microlens 90 at the corresponding wavelength range.

Thus, an incident light onto each pixel may be refracted when it penetrates through the microlens 90, and may be further refracted when it penetrates through a corresponding one of the color filters 82, 84, and 86. A size of a beam spot condensed through the refraction of the incident light, that is, a diameter D may decrease as the refraction of the incident light by the microlens 90 and the corresponding one of the color filters 82, 84, and 86 increases, and thus may have a value less than that of a size of a beam spot in comparative embodiment including color filters having relatively low refractive indices. For example, the color filters 82, 84, and 86 in accordance with example embodiments may have relatively high refractive indices greater than those of the color filters in comparative embodiment, and thus the condensation efficiency of the incident light onto each pixel may increase, and the beam spot size may be reduced to increase the effective pixel area.

As illustrated above, when the interference blocking structure 60 includes a relatively low refractive index material, the surface reflection thereof rate may be high, and thus the condensation efficiency of the incident light onto each pixel may be further enhanced when the interference blocking structure 60 is used together with the color filters 82, 84, and 86 having the relatively high refractive indices.

In example embodiments, each of the color filters 82, 84, and 86 in accordance with example embodiments may have an absorbance (k), which indicates a degree of absorbing a light of a filter in a wavelength range not to penetrate through the filter, greater than that of a corresponding one of the color filters in comparative embodiment. For example, the green filter G in accordance with example embodiments had an absorbance of about 0.1 to about 0.4 in a wavelength range of about 600 nm to about 700 nm, the blue filter B in accordance with example embodiments had an absorbance of about 0.1 to about 0.4 in a wavelength range of about 550 nm to about 700 nm, and the red filter R in accordance with example embodiments had an absorbance of about 0.1 to about 0.5 in a wavelength range of about 450 nm to about 580 nm.

As each of the color filters 82, 84, and 86 has the relatively high absorbance, each of the color filters 82, 84, and 86 may have desired spectrum characteristics even with a relatively small thickness T. Thus, in accordance with example embodiments, each of the green filter G and the blue filter B may have a thickness of about 2000 Å to about 5000 Å, and the red filter R may have a thickness of about 3000 Å to about 6000 Å. As each of the color filters 82, 84, and 86 may have the relatively small thickness, a focus of a beam including incident lights onto each pixel may be adjusted to be adjacent to the light sensing element 30.

In example embodiments, each of the color filters 82, 84, and 86 may have a pigment weight ratio greater than that of a corresponding one of the color filters in comparative embodiment. Each of the color filters 82, 84, and 86 may be a film deposited using a composition that may be formed by mixing a pigment, a pigment dispersant, a binder resin and a solvent. The composition may further include a functional group that may help the pigment dispersant to adsorb onto a surface of the pigment so that the dispersibility of the pigment may be enhanced. Accordingly, the weight ratio of the pigment in the composition may increase.

In example embodiments, a green pigment may have about 35 wt % to about 50 wt % in the first color filter 82, which is a green filter G or a green filter composition for forming the first color filter 82. A blue pigment may have about 30 wt % to about 45 wt % in the second color filter 84, which is a blue filter B or a blue filter composition for forming the second color filter 84. A red pigment may have about 35 wt % to about 55 wt % in the third color filter 86, which is a red filter R or a red filter composition for forming the third color filter 86.

As each of the color filters 82, 84, and 86 has the relatively high pigment weight ratio, each of the color filters 82, 84, and 86 may have a relatively high refractive index (n) and a relatively high absorbance (k).

As illustrated above, the pixels included in the image sensor in accordance with example embodiments may include the color filters 82, 84, and 86 having the relatively high refractive indices and the relatively high absorbances, and thus each of the pixels may have an enhanced light condensation efficiency and a reduced beam spot size generated by an incident light. Accordingly, the image sensor may have an increased effective pixel area, and each of the color filters 82, 84, and 86 may have desired spectrum characteristics even with a small thickness. As each of the color filters 82, 84 and 86 has the relatively small thickness, the focus of the incident light may be adjusted to be adjacent to the light sensing element 30, and thus each pixel may have enhanced sensitivity.

Figure 5:
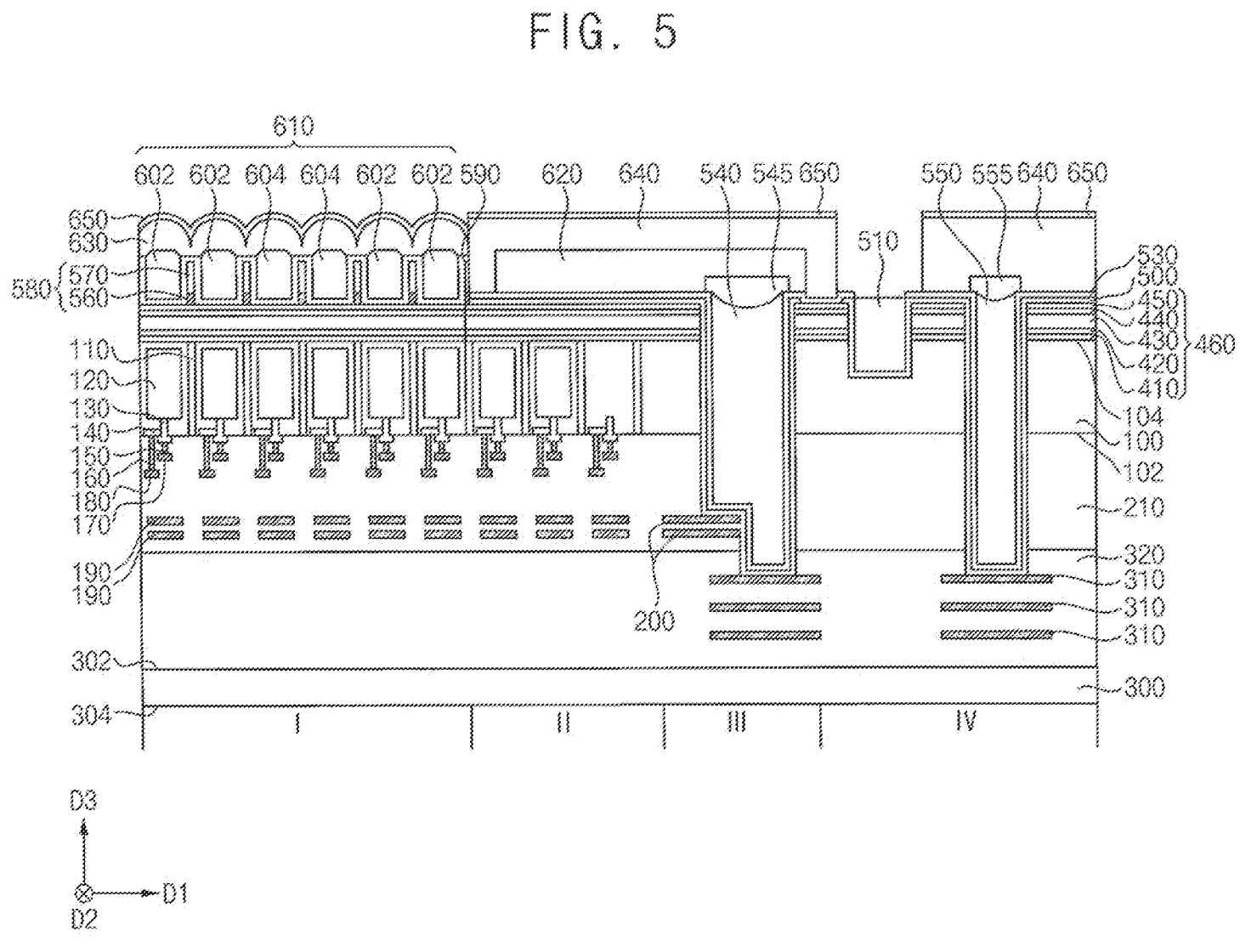

FIG. 5 is a cross-sectional view illustrating an image sensor in accordance with example embodiments. This image sensor may include the pixels and the components of the pixels, e.g., the color filter array layer, the interference blocking structure, etc., and thus repeated explanations are omitted herein.

Hereinafter, two directions substantially parallel to a first surface 102 of a first substrate 100 and substantially perpendicular to each other may be referred to as a first direction D1 and a second direction D2, respectively, and a direction substantially perpendicular to the first surface 102 of the first substrate 100 may be referred to as a third direction D3. In example embodiments, the first and second directions D1 and D2 may be substantially perpendicular to each other.

Referring to FIG. 5, the image sensor may include a second substrate 300, a second insulating interlayer 320, a first insulating interlayer 210, the first substrate 100, and a lower planarization layer 460 sequentially stacked in the third direction D3 in a first region I, a second region II, a third region III, and a fourth region IV. A color filter array layer 610, a microlens 630 and a transparent protection layer 650 may be sequentially stacked on the lower planarization layer 460 in the first region I. A light blocking layer 620, an upper planarization layer 640 and the transparent protection layer 650 may be sequentially stacked on the lower planarization layer 460 in the second and third regions II and III, and the upper planarization layer 640 and the transparent protection layer 650 may be sequentially stacked on the lower planarization layer 460 in the fourth region IV.

The image sensor may further include a first wiring 170, a second wiring 180, and a third wiring 190 and a first via 150 and a second via 160 contained in the first insulating interlayer 210, a pixel division pattern 110 extending through the first substrate 100 in the third direction D3, a light sensing element 120 in a unit pixel region defined by the pixel division pattern 110, a transfer gate (TG) 130 extending through a lower portion of the first substrate 100 and having a lower portion protruding downwardly from the first surface 102 of the first substrate 100 and covered by the first insulating interlayer 210, and a floating diffusion (FD) region 140 at a lower portion of the first substrate 100 adjacent to the TG 130 in the first and second regions I and II.

The image sensor may further include an interference blocking structure 580 between color filters 602 and 604 included in the color filter array layer 610 and a protection layer 590 covering a surface of the interference blocking structure 580 on the lower planarization layer 460.

The image sensor may further include a fourth wiring 200 contained in the first insulating interlayer 210, a fifth wiring 310 contained in the second insulating interlayer 320, and a first through via structure extending through the lower planarization layer 460, the first substrate 100, the first insulating interlayer 210 and an upper portion of the second insulating interlayer 320 to commonly contact the fourth and fifth wirings 200 and 310 in the third region III.

The image sensor may further include the fifth wiring 310 contained in the second insulating interlayer 320, a pad 510 extending through the lower planarization layer 460 and an upper portion of the first substrate 100, and a second through via structure extending through the lower planarization layer 460, the first substrate 100, the first insulating interlayer 210 and an upper portion of the second insulating interlayer 320 to contact the fifth wiring 310 in the fourth region IV.

The image sensor may further include various transistors disposed under the first substrate 100 adjacent to the first surface 102 of the first substrate 100. The transistors may include, e.g., a source follower transistor, a reset transistor, and a select transistor. The TG 130 and the light sensing element 120 may form a transfer transistor. The light sensing element 120 may serve as a source region of the transfer transistor, and the FD region 140 may serve as a drain region of the transfer transistor.

The first to fourth regions I, II, III, and IV may refer to not only an inner portion of the first substrate 100 or an inner portion of the second substrate 300, but also a space over and under the first substrate 100 or the second substrate 300. In example embodiments, in a plan view, the first region I may have a shape of a square or rectangle, the second region II may surround and be provided adjacent to the first region I, the fourth region IV may surround and be provided adjacent to the second region II, and the third region III may be disposed in the fourth region IV, however, embodiments are not limited thereto.

In example embodiments, the first region I may be an active pixel region in which active pixels are formed, the second region II may be an optical black (OB) region in which OB pixels are formed, the third region III may be a stack region in which the first through via structure is formed, and the fourth region IV may be a pad region in which the pads 510 are formed.

The first substrate 100 may include the first surface 102 and a second surface 104 opposite the first surface 102. The second substrate 300 may include a third region 302 and a fourth region 304 opposite the third region 302. FIG. 5 shows the first surface 102 is disposed under the second surface 104, and the third region 302 is disposed over the fourth surface 304.

In example embodiments, p-type impurities may be doped into the first substrate 100 partially or entirely to form a p-type well therein.

The pixel division pattern 110 may extend in the third direction D3 in the first and second regions I and II of the first substrate 100, and may be arranged in a lattice pattern in the first and second directions D1 and D2, in a plan view. A unit pixel region defined by the pixel division pattern 110 may be arranged in the first and second directions D1 and D2.

In example embodiments, the light sensing element 120 may be a portion of a photodiode (PD). The light sensing element 120 may be an n-type impurity region in the p-type well in the first and second regions I and II of the first substrate 100, and thus the light sensing element 120 and the p-type well may form a PN junction diode. In an example embodiment, p-type impurities may be highly doped into a portion of the first substrate 100 adjacent to the pixel division pattern 110, and thus the PN junction diode may have enhanced characteristics.

The light sensing element 120 may be formed in each unit pixel region defined by the pixel division pattern 110 in the first and second regions I and II of the first substrate 100. However, the light sensing element 120 may not be formed in some of the unit pixel regions defined by the pixel division pattern 110 in the second region II of the first substrate 100.

The TG 130 may include a filling portion extending in the third direction D3 from the first surface 102 of the first substrate 100, and a protrusion beneath the filling portion and having a lower surface lower than the first surface 102 of the first substrate 100.

The FD region 140 may be adjacent to the first surface 102 of the first substrate 100 and the TG 130, and may be, e.g., an n-type impurity region.

The first via 150 may contact the overlying TG 130, and may be connected to the underlying first wiring 170. The second via 160 may contact the overlying FD region 140, and may be connected to the underlying second wiring 180.

Vias and wirings connected to the various transistors, that is, the source follower transistor, the reset transistor, and the select transistor may be further formed in the first insulating interlayer 210 in the first and second regions I and II. FIG. 5 shows each of the third and fourth wirings 190 and 200 are formed at two levels in the third direction D3, however, embodiments are not limited thereto, and may be formed at more than two levels.

Each of the first and second insulating interlayers 210 and 320 may include an oxide, e.g., silicon oxide, or a low-k dielectric material.

In an example embodiment, the lower planarization layer 460 may include a first layer 410, a second layer 420, a third layer 430, a fourth layer 440, and a fifth layer 450 sequentially stacked in the third direction D3. For example, the first to fifth layers 410, 420, 430, 440, and 450 may include aluminum oxide, hafnium oxide, silicon oxide, silicon nitride and hafnium oxide, respectively.

The interference blocking structure 580 may be formed on the lower planarization layer 460 to overlap the pixel division pattern 110 in the third direction D3, and may have a lattice pattern in a plan view. In example embodiments, the interference blocking structure 580 may include a first interference blocking pattern 560 and a second interference blocking pattern 570 stacked in the third direction D3. The first interference blocking pattern 560 may include a metal having a relatively low light absorption rate, e.g., tungsten, and the second interference blocking pattern 570 may include a relatively low refractive index material (LRIM), e.g., silicon oxide. According to another example embodiment, the interference blocking structure 580 may be a single layer including a transparent material having a relatively low refractive index.

The protection layer 590 may include a metal oxide, e.g., aluminum oxide. The color filter array layer 610 may be formed on the protection layer 590, and thus a lower surface and a sidewall of each of the first color filter 602, the second color filter 604 and the third color filter included in the color filter array layer 610 may be covered by the protection layer 590.

The light blocking layer 620 may include the same composition as the second color filter 604, which may absorb light having a relatively large wavelength among the first and second color filters 602 and 604 and the third color filter.

The light blocking layer 620 may be formed on the lower planarization layer 460, the first through via structure and an insulation pattern 530 in the second and third regions II and III of the first substrate 100, however, may not be formed on a portion of the insulation pattern 530 on a fourth trench 520, which may be formed by partially removing a portion of a conductive pattern 500 on the lower planarization layer 460 at a boundary of the third and fourth regions III and IV to expose an upper surface of the lower planarization layer 460.

The first through via structure may include a first filling pattern 540 extending in the third direction D3 through the lower planarization layer 460, the first substrate 100, the first insulating interlayer 210 and an upper portion of the second insulating interlayer 320, the insulation pattern 530 covering a lower surface and a sidewall of the first filling pattern 540, the conductive pattern 500 covering a lower surface and a sidewall of the insulation pattern 530, and a first capping pattern 545 on an upper surface of the first filling pattern 540.

The second through via structure may include a second filling pattern 550 extending in the third direction D3 through the lower planarization layer 460, the first substrate 100, the first insulating interlayer 210 and an upper portion of the second insulating interlayer 320, the insulation pattern 530 covering a lower surface and a sidewall of the second filling pattern 550, the conductive pattern 500 covering a lower surface and a sidewall of the insulation pattern 530, and a second capping pattern 555 on an upper surface of the second filling pattern 550.

Each of the first and second filling patterns 540 and 550 may include, e.g., a relatively low refractive index material, and each of the first and second capping patterns 545 and 555 may include, e.g., a photoresist material.

A portion of the conductive pattern 500 included in the first through via structure may commonly contact the fourth and fifth wirings 200 and 310 so that the fourth and fifth wirings 200 and 310 may be electrically connected with each other, and a portion of the conductive pattern 500 included in the second through via structure may contact the fifth wiring 310 so as to be electrically connected thereto. The conductive pattern 500 may be included in the first and second through via structures, and may also be formed on the lower planarization layer 460 in the second to fourth regions II, III, and IV.

The conductive pattern 500 may include a metal, e.g., tungsten. In an example embodiment, a barrier pattern including a metal nitride, e.g., titanium nitride may be further formed under the conductive pattern 500.

The insulation pattern 530 may be included in the first and second through via structures, and may also be formed on the portion of the conductive pattern 500 on the lower planarization layer 460 in the second to fourth regions II, III, and IV. As illustrated above, the insulation pattern 530 may also be formed on the fourth trench 520 exposing the upper surface of the lower planarization layer 460 to partially contact the lower planarization layer 460. The insulation pattern 530 may include an oxide, e.g., silicon oxide.

The pad 510 may be electrically connected with an outer wiring, and may be a path through which electrical signals may be input into the active pixels and/or the OB pixels, or electrical signals may be output from the active pixels and/or the OB pixels. The pad 510 may include a metal, e.g., aluminum. A lower surface and a sidewall of the pad 510 may be covered by the conductive pattern 500.

The microlens 630 may be formed on the color filter array layer 610 and the protection layer 590 in the first region I, and the upper planarization layer 640 may be formed on the light blocking layer 620, the insulation pattern 530 and the second through via structure in the second to fourth regions II, III, and IV. However, the upper planarization layer 640 may include a third opening 660 exposing an upper surface of the pad 510 in the fourth region IV. In example embodiments, the microlens 630 and the upper planarization layer 640 may include substantially the same material, e.g., a photoresist material having a high transmittance.

The transparent protection layer 650 may be formed on the microlens 630 and the upper planarization layer 640. The transparent protection layer 650 may include, e.g., silicon oxide (SiO), silicon oxycarbide (SiOC), silicon carbide (SiC), silicon carbon-nitride (SiCN), etc.

In the image sensor in accordance with example embodiments, each active pixel in the first region I may include one of the first color filter 602, the second color filter 604 and the third color filter having a relatively high refractive index (n) and a relatively high absorbance (k). Thus, the light condensation efficiency of each active pixel may increase and the beam spot size may decrease so that the effective pixel area may increase. Additionally, each of the first color filter 602, the second color filter 604 and the third color filter may have desired spectrum characteristics even with a relatively small thickness. Furthermore, as each of the first color filter 602, the second color filter 604 and the third color filter may have the relatively small thickness, the focus of the incident light may be adjacent to the light sensing element 120, and thus the each active pixel may have enhanced sensitivity.

FIGS. 6 to 12 are cross-sectional views illustrating a method of manufacturing an image sensor in accordance with example embodiments.

Figure 6:
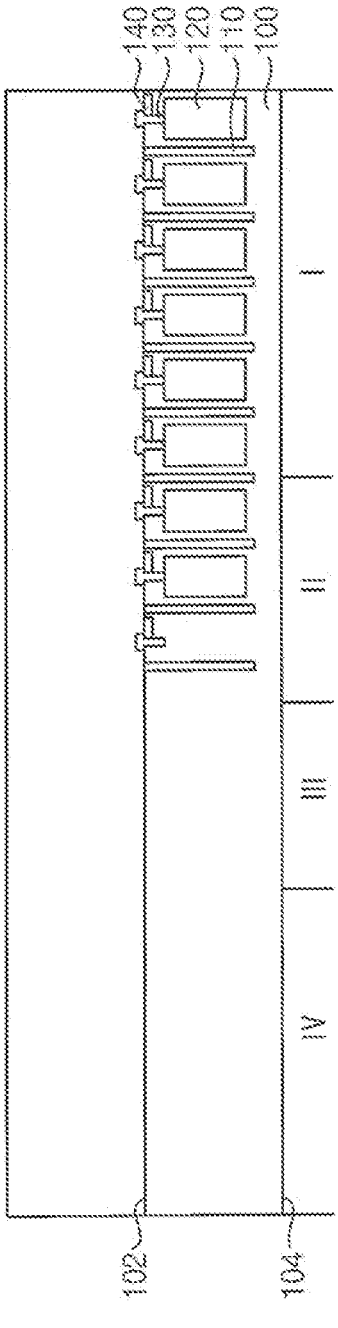
Figure 6:
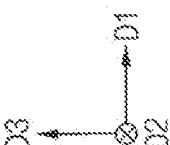

Referring to FIG. 6, a pixel division pattern 110 and a light sensing element 120 may be formed in the first substrate 100 including first, second, third and fourth regions I, II, III, and IV. A TG 130 and an FD region 140 may be additionally formed.

In example embodiments, p-type impurities may be doped into a portion or an entire portion of the first substrate 100 to form a p-type well.

The pixel division pattern 110 may fill a first trench extending in the third direction D3 from a first surface 102 downwardly in the first and second regions I and II of the first substrate 100 including the first surface 102 and a second surface 104 opposite to the first surface 102. In example embodiments, the pixel division pattern 110 may have a lattice pattern arranged in the first and second directions D1 and D2 in a plan view.

In example embodiments, the light sensing element 120 may be a portion of a photodiode (PD). Thus, the light sensing element 120 may be formed by doping n-type impurities into the p-type well in the first and second regions I and II of the first substrate 100, and the light sensing element 120 and the p-type well may form a PN junction diode. In an example embodiment, after forming the first trench for forming the pixel division pattern 110, p-type impurities may be highly doped at a portion of the first substrate 100 adjacent to the first trench, and the PN junction diode may have enhanced performance.

According to another example embodiment, after forming the light sensing element 120, the pixel division pattern 110 may be formed.

The TG 130 may fill a second trench extending in the third direction D3 from the first surface 102 downwardly in the direction D3. In example embodiments, the TG 130 may include a filling portion filling the second trench, and a protrusion on the filling portion and having an upper surface higher than the first surface 102 of the first substrate 100.

For example, n-type impurities may be doped into a portion of the first substrate 100 adjacent to the first surface 102 and the TG 130 to form the FD region 140.

Figure 7:
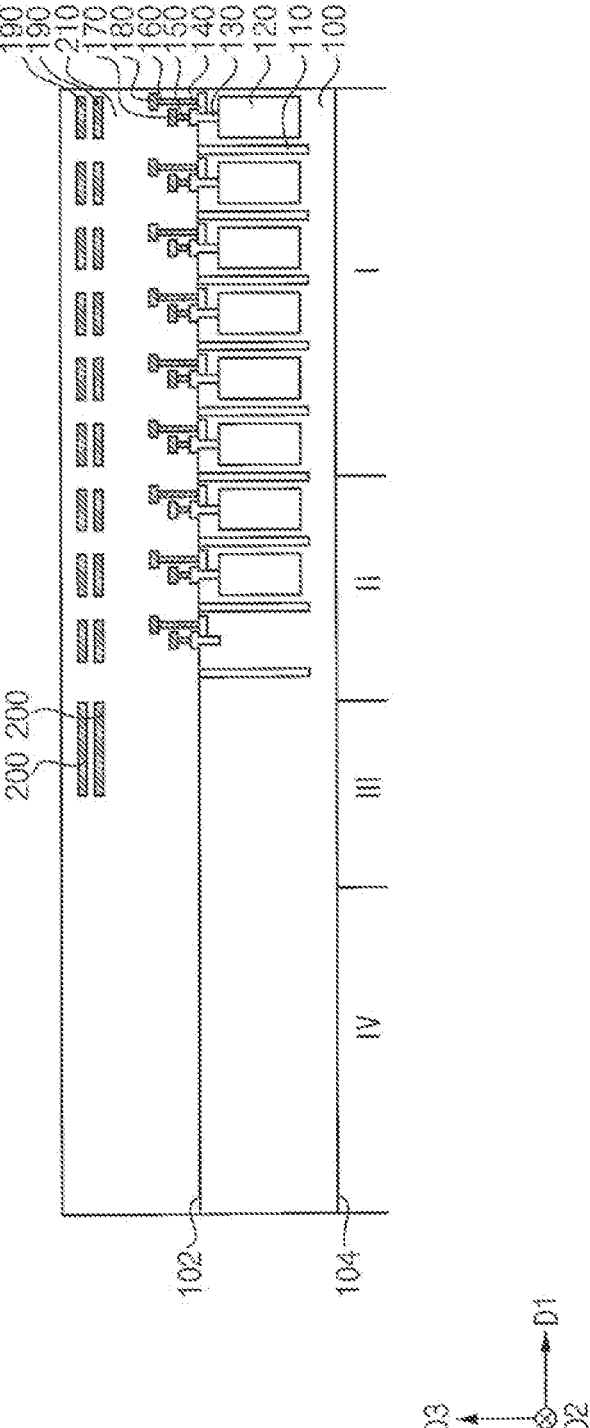

Referring to FIG. 7, a first insulating interlayer 210 containing first and second vias 150 and 160 and first to fourth wirings 170, 180, 190 and 200 may be formed on the first surface 102 of the first substrate 100.

The first via 150 may contact the TG 130, and may be connected to the first wiring 170. The second via 160 may contact the FD region 140, and may be connected to the second wiring 180. The first to third wirings 170, 180, and 190 may be formed in the first and second regions I and II of the first substrate 100, and the fourth wiring 200 may be formed in the third region III of the first substrate 100.

Various transistors, that is, a source follower transistor, a reset transistor and a select transistor, and visas and wirings may be further formed. In example embodiments, the first and second vias 150 and 160 and the first to fourth wirings 170, 180, 190, and 200 may be formed by a dual damascene process or a single damascene process.

Figure 8:
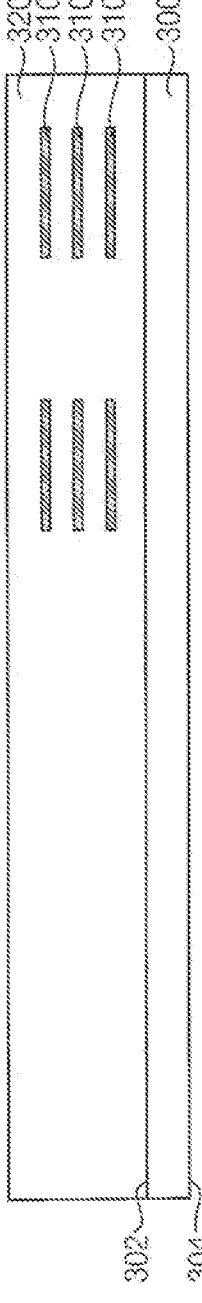

Referring to FIG. 8, a second insulating interlayer 320 containing a fifth wiring 310 may be formed on a third surface 302 of the second substrate 300 including the third surface 302 and a fourth surface 304 opposite thereto.

FIG. 8 shows the fifth wiring 310 is formed at three levels, however, embodiments are not limited thereto. The fifth wirings 310 may be electrically connected with each other by vias in the second insulating interlayer 320. In example embodiments, the fifth wirings 310 and the vias may be formed by a dual damascene process or a single damascene process.

Figure 9:
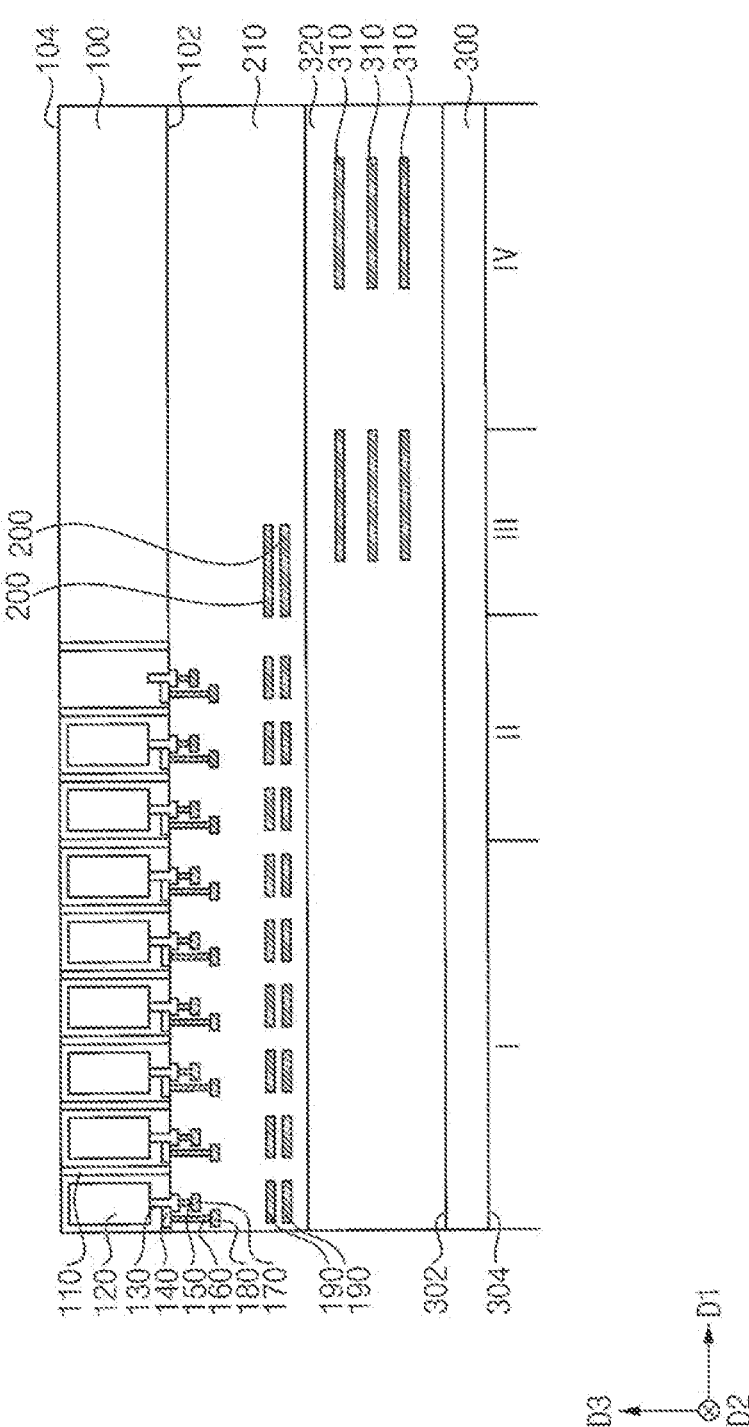

Referring to FIG. 9, the first insulating interlayer 210 formed on the first substrate 100 and the second insulating interlayer 320 formed on the second substrate 300 may be bonded with each other, and a portion of the first substrate 100 adjacent to the second surface 104 may be removed.

In example embodiments, the first and second insulating interlayers 210 and 320 may be bonded through a bonding layer. According to another example embodiment, the first and second insulating interlayers 210 and 320 may be bonded with no bonding layer. After bonding the first and second insulating interlayers 210 and 320, the bonded structure may be overturn so that the second surface 104 of the first substrate 100 may face upward. Hereinafter, the bonded structure will be explained with the second surface 104 of the first substrate 100 facing upward.

As the first and second substrates 100 and 300 are bonded with each other, the fifth wirings 310 on the second substrate 300 may be disposed in the third and fourth regions III and IV of the first substrate 100.

In example embodiments, the portion of the first substrate 100 adjacent to the second surface 104 may be removed by a polishing process, e.g., a grinding process. Thus, the pixel division pattern 110 may be exposed, and the pixel division pattern 110 may extend through the first substrate 100.

Figure 10:
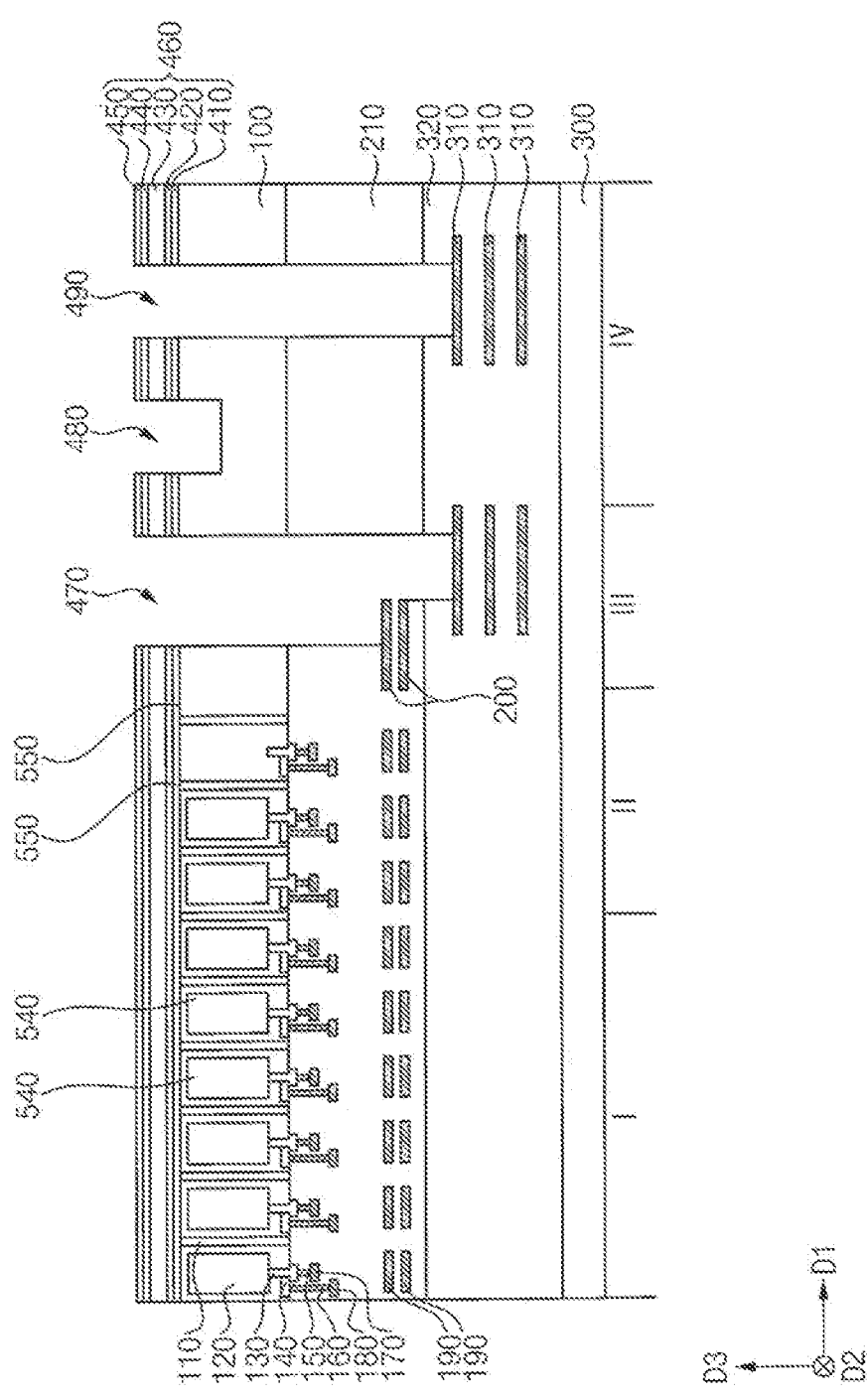

Referring to FIG. 10, a lower planarization layer 460 may be formed on the second surface 104 of the first substrate 100.

In an example embodiment, the lower planarization layer 460 may include first to fifth layers 410, 420, 430, 440 and 450 sequentially stacked in the third direction D3.

The lower planarization layer 460, the first substrate 100, the first insulating interlayer 210 and an upper portion of the second insulating interlayer 320 in the third region III of the first substrate 100 may be partially removed to form a first opening 470, the lower planarization layer 460 and an upper portion of the first substrate 100 in the fourth region IV may be removed to form a third trench 480, and the lower planarization layer 460, the first insulating interlayer 210 and an upper portion of the second insulating interlayer 320 in the fourth region IV of the first substrate 100 may be removed to form a second opening 490.

The first opening 470 may expose the fourth wiring 200 in the first insulating interlayer 210 and the fifth wiring 310 in the second insulating interlayer 320, and the second opening 490 may expose the fifth wiring 310 in the second insulating interlayer 320.

Figure 11:
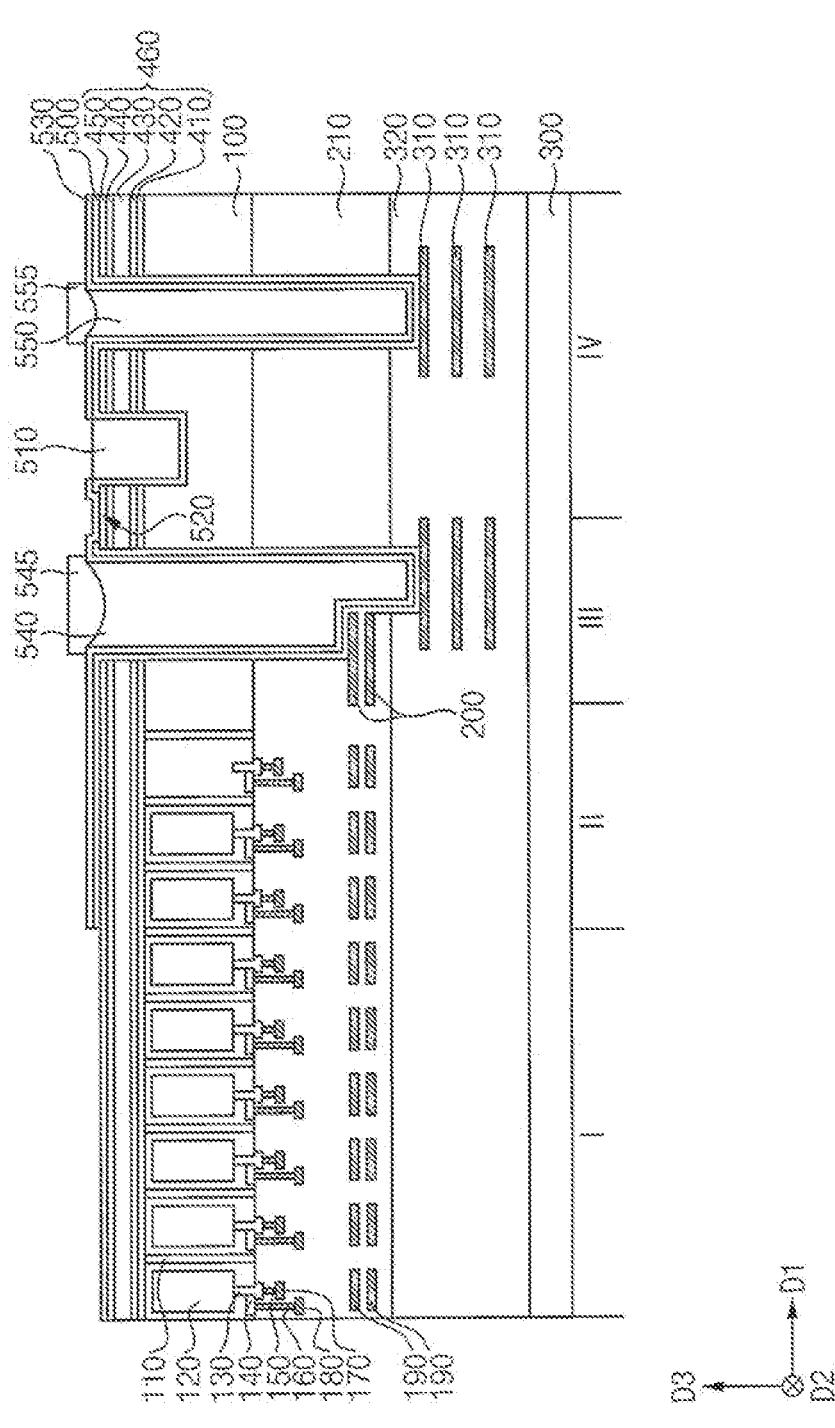

Referring to FIG. 11, a first conductive layer may be formed on the bottoms and sides of the first and second openings 470 and 490 and the third trench 480 and an upper surface of the lower planarization layer 460. A second conductive layer may be formed on the first conductive layer to fill the third trench 480, and an upper portion of the second conductive layer may be exposed until an upper surface of the first conductive layer is exposed.

Thus, a pad 510 may be formed on the first conductive layer in the third trench 480 in the fourth region IV of the first substrate 100.

The planarization process may be performed by, e.g., a chemical mechanical polishing (CMP) process and/or an etch back process.

Before forming the first conductive layer, a barrier layer may be further formed on the bottoms and sides of the first and second openings 470 and 490 and the third trench 480 and the upper surface of the lower planarization layer 460.

The first conductive layer may be partially removed at a boundary area between the third and fourth regions III and IV of the first substrate 100 to form a fourth trench 520 exposing an upper surface of the lower planarization layer 460.

An insulation layer may be formed on upper surfaces of the first conductive layer and the pad 510 and a bottom and a sidewall of the fourth trench 520. A filling layer may be formed on the insulation layer to fill the first and second openings 470 and 490, and an upper portion of the filling layer may be planarized until an upper surface of the insulation layer is exposed.

An additional etching process may be performed on the filling layer so that a portion of the filling layer in the fourth trench 520 may be removed, and thus a first filling pattern 540 may be formed on the insulation layer in the first opening 470 in the third region III of the first substrate 100, and a second filling pattern 550 may be formed on the insulation layer in the second opening 490 in the fourth region IV of the first substrate 100.

A capping layer may be formed on the first and second filling patterns 540 and 550 and the insulation layer, and patterned to form first and second capping patterns 545 and 555 on the first and second filling patterns, respectively.

A portion of the insulation layer in the first region I of the first substrate 100 and a portion of the insulation layer on the pad 510 may be removed to form an insulation pattern 530, and a portion of the first conductive layer in the first region I of the first substrate 100 may be removed to form a conductive pattern 500. Thus, an upper surface of the lower planarization layer 460 in the first region I of the first substrate 100 may be exposed.

When the barrier layer is formed under the first conductive layer, the barrier layer may also be partially removed when the portion of the first conductive layer is removed to form a barrier pattern.

A portion of the conductive pattern 500 and the insulation pattern 530 in the first opening 470, the first filling pattern 540 and the first capping pattern 545 in the third region III of the first substrate 100 may form a first through via structure. A portion of the conductive pattern 500 and the insulation pattern 530 in the second opening 490, the second filling pattern 550, and the second capping pattern 555 in the fourth region IV of the first substrate 100 may form a second through via structure.

Figure 12:
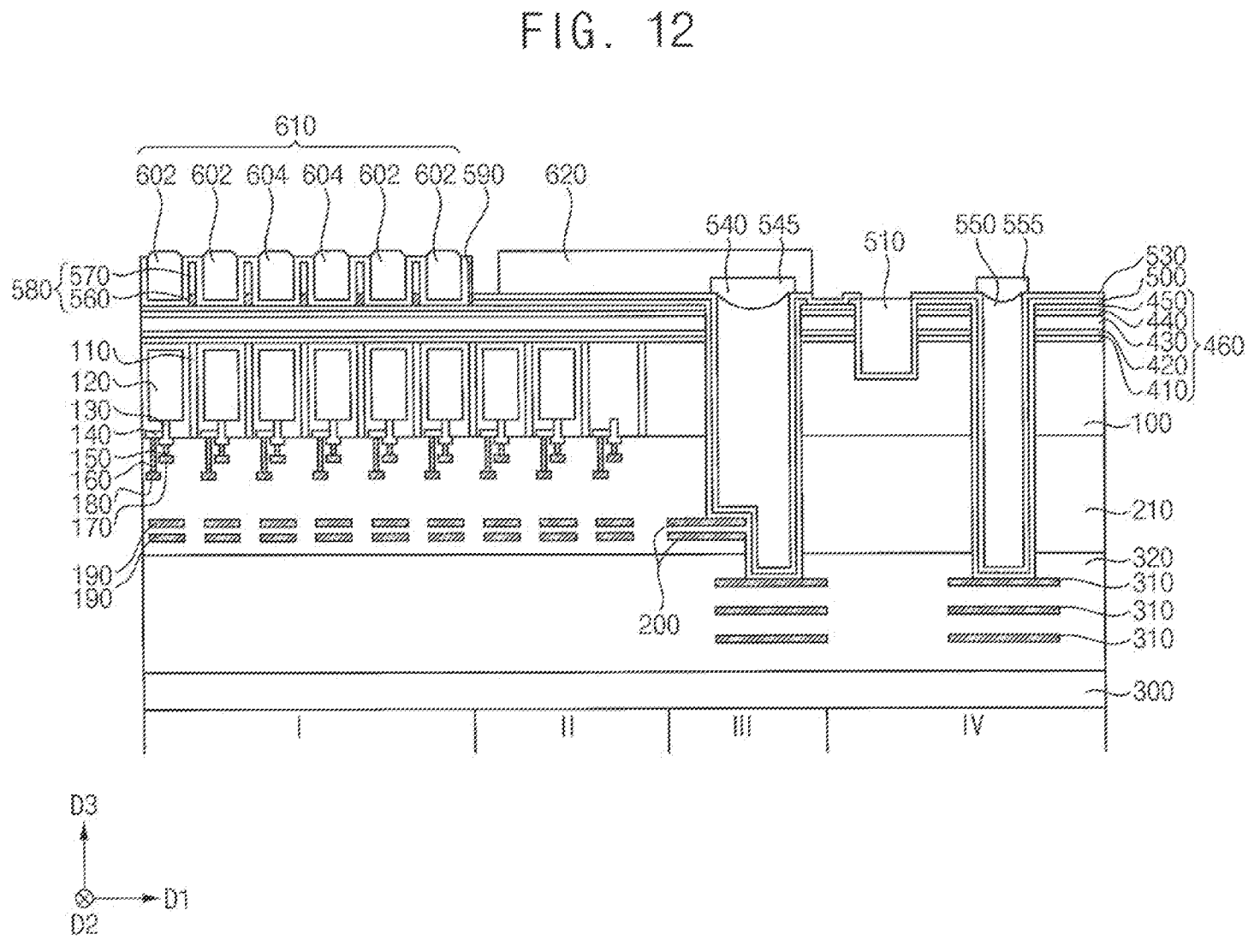

Referring to FIG. 12, an interference blocking structure 580 may be formed on an upper surface of the lower planarization layer 460 in the first region I of the first substrate 100, and a protection layer 590 may be formed on the lower planarization layer 460 and the interference blocking structure 580.

The interference blocking structure 580 may be formed to overlap the pixel division pattern 110 in the third direction D3, and may have a lattice pattern in a plan view.

In example embodiments, the interference blocking structure 580 may include first and second interference blocking patterns 560 and 570 stacked in the third direction D3. According to another example embodiment, the interference blocking structure 580 may have a single layer structure including a transparent material having a relatively low refractive index.

A color filter array layer 610 may be formed on the protection layer 590 in the first region I of the first substrate 100. A light blocking layer 620 may be formed on the insulation pattern 530 and the first capping pattern 545 in the second and third regions II and III of the first substrate 100.

In example embodiments, a first color filter 602 may be formed in a first portion of an area that may be defined by the interference blocking structure 580, a second color filter 604 may be formed in a second portion of the area, and a third color filter may be formed in a third portion of the area, so that the color filter array layer 610 may be formed. Each of the first color filter 602, the second color filter 604 and the third color filter may be formed by depositing a color filter layer including the composition illustrated with reference to FIGS. 1 to 4 and performing an exposure process and a developing process on the color filter layer.

For example, when the second color filter 604, which may absorb a light of a relatively large wavelength and through which a light of a relatively short wavelength may penetrate, is formed, the light blocking layer 620 including the same composition as the second color filter 604 may be formed on the lower planarization layer 460, the first capping pattern 545 and the insulation pattern 530 in the second region II of the first substrate 100. The light blocking layer 620 may not be formed on a portion of the insulation pattern 530 in the fourth trench 520 (refer to FIG. 11).

Referring to FIG. 5, an upper planarization layer 640 may be formed on the color filter array layer 610, the protection layer 590, the light blocking layer 620, the insulation pattern 530, the pad 510 and the second capping pattern 555 in the first to fourth regions I, II, III, and IV of the first substrate 100, and a patterning process and a reflow process may be performed on the upper planarization layer 640 in the first region I of the first substrate 100 to form a microlens 630.

A transparent protection layer 650 may be formed on the microlens 630 and the upper planarization layer 640, and a portion of the transparent protection layer 650 overlapping the pad 510 in the fourth region IV of the first substrate 100 and a portion of the upper planarization layer 640 thereunder may be removed to form a third opening 660 exposing an upper surface of the pad 510.

An upper wiring may be further formed to be electrically connected to the pad 510 so that the fabrication of the image sensor may be completed.

Figure 13:
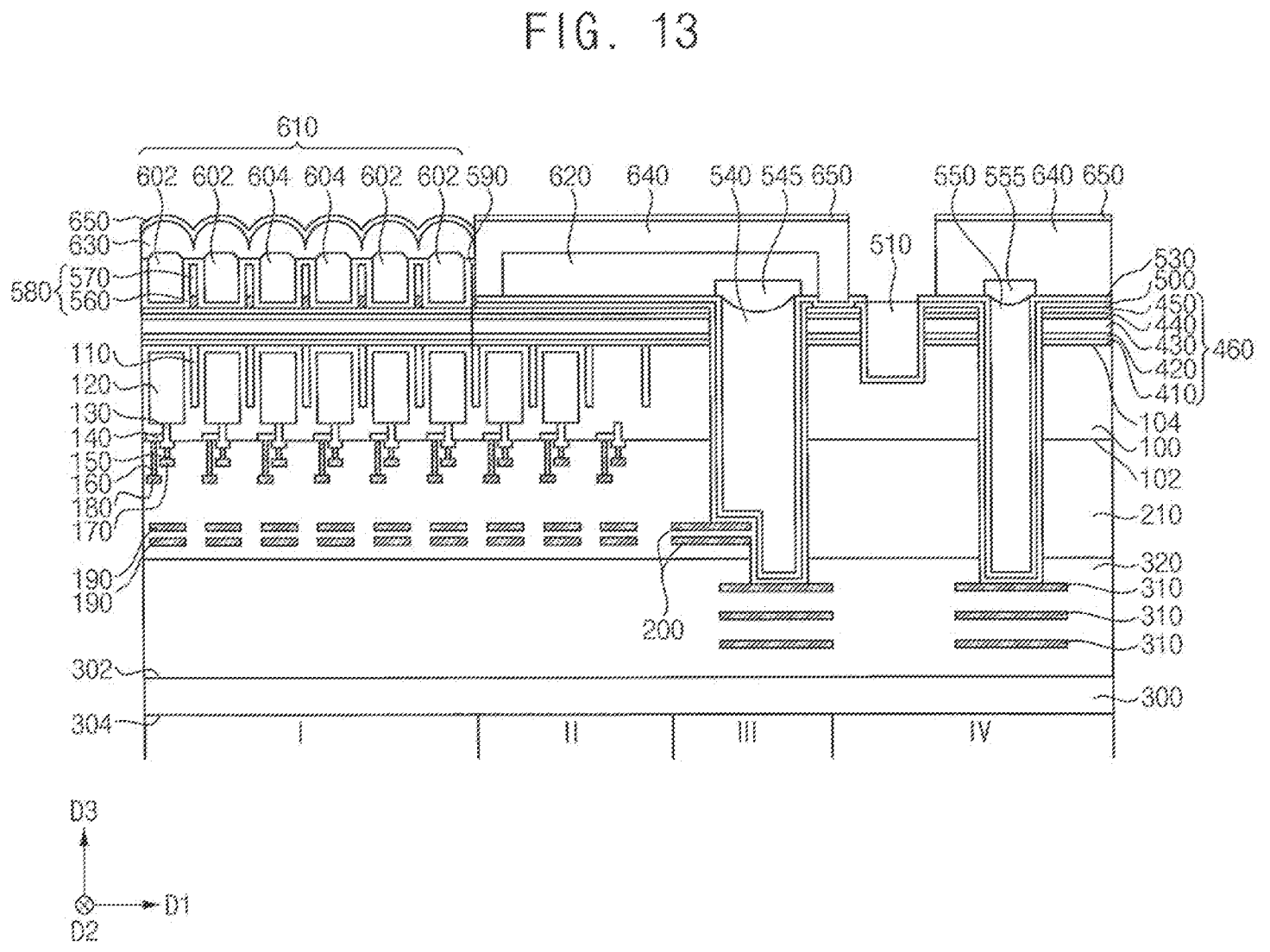

FIG. 13 is a cross-sectional view illustrating an image sensor in accordance with example embodiments. This image sensor may be substantially the same as or similar to that of FIG. 5, except for the pixel division pattern 110.

Referring to FIG. 13, the pixel division pattern 110 may extend in the third direction D3 downwardly from the second surface 104 of the first substrate 100. However, the pixel division pattern 110 may not entirely penetrate through the first substrate 100, but may penetrate through an upper portion and a middle portion of the first substrate 100.

The pixel division pattern 110 shown in FIG. 13, unlike the pixel division pattern 110 shown in FIG. 5, may not be formed during the processes illustrated with reference to FIG. 6. For example, the pixel division pattern 110 as illustrated in FIG. 13 may be formed by bonding the first and second substrates 100 and 300 illustrated with reference to FIG. 9, removing a portion of the first substrate 100 near the second surface 104, forming a fifth trench extending downwardly in the third direction D3 through the first substrate 100 from the second surface 104, and filling a material into the fifth trench. The fifth trench may not extend to the first surface 102 of the first substrate 100, and thus the pixel division pattern 110 may not entirely extend through the first substrate 100, but may extend through a portion of the first substrate 100.

Figure 14:
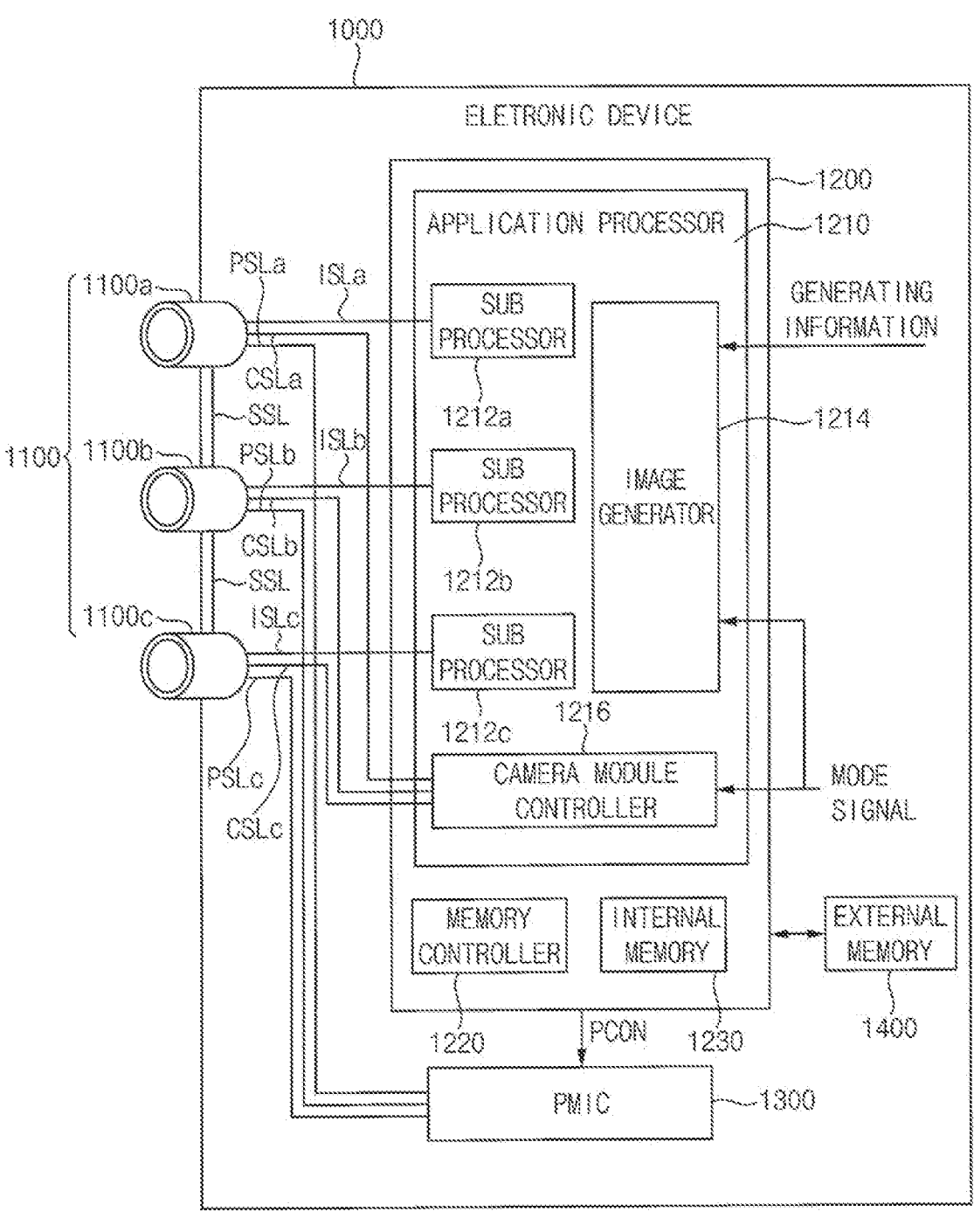
FIG. 14 is a block diagram illustrating an electronic device including an image sensor according to example embodiments.
Figure 15:
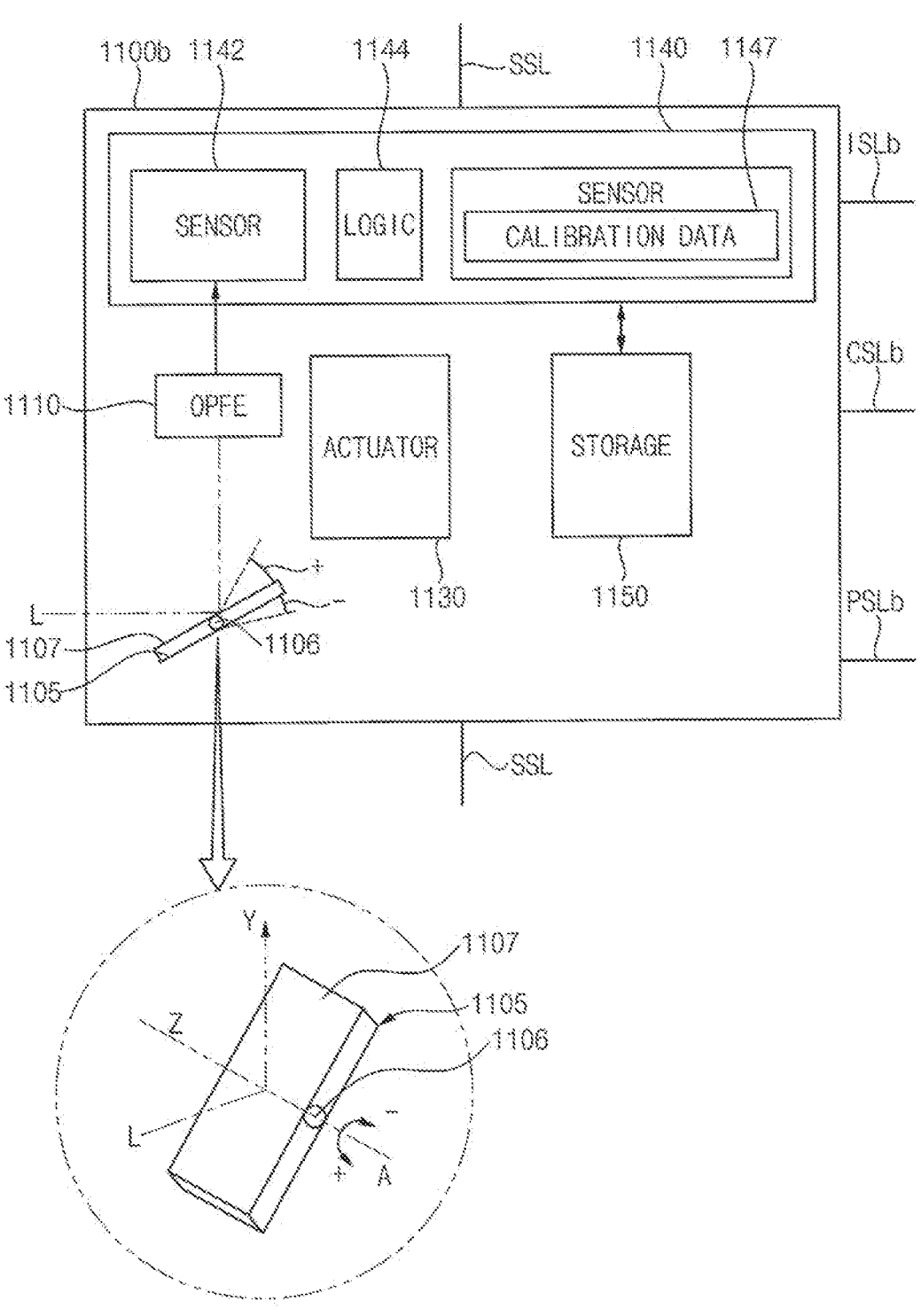
FIG. 15 is a block diagram illustrating a camera device included in the electronic device of FIG. 14.

FIG. 14 is a block diagram illustrating an electronic device including an image sensor in accordance with example embodiments, and FIG. 15 is a block diagram illustrating a camera device included in the electronic device of FIG. 14.

The image sensor may be the image sensor illustrated with reference to FIG. 5 or FIG. 13 including the pixels illustrated with reference to FIGS. 1 to 4.

Referring to FIG. 14, an electronic device 1000 may include a camera device group 1100, an application processor 1200, a power management integrated circuit (PMIC) 1300 and an external memory 1400.

The camera device group 1100 may include a plurality of camera devices 1100a, 1100b and 1100c. FIG. 14 illustrates the three camera devices 1100a, 1100b and 1100c as an example, however, embodiments are not limited to a particular number of camera devices. According to example embodiments, the camera device group 1100 may include only two camera devices, or more than three camera devices.

Hereinafter, an example configuration of the camera device 1100b is described with reference to FIG. 15, however, the same descriptions may be applied to the other camera devices 1100a and 1100c.

Referring to FIG. 15, the camera device 1100b may include a prism 1105, an optical path folding element (OPFE) 1110, an actuator 1130, an image sensing device 1140 and a storage device 1150.

The prism 1105 may include a reflection surface 1107 that may change a path of a light L incident onto the prism 1105.

In example embodiments, the prism 1105 may change the path of the light L incident in a first direction X to a second direction Y perpendicular to the first direction X. In addition, the prism 1105 may rotate the reflection surface 1107 around a center axis 1106 in A direction and/or rotate the center axis 1106 in a B direction to align the path of the reflected light along the second direction Y. The OPFE 1110 may move in a third direction Z perpendicular to the first direction X and the second direction Y.

In example embodiments, a rotation angle of the prism 1105 may be equal to or less than about 15 degrees in the positive (+) A direction and equal to or more than about 15 degrees in the negative (−) A direction, but embodiments are not limited thereto.

In example embodiments, the prism 1105 may rotate within about 20 degrees, between about 10 degrees and about 20 degrees, or between about 15 degrees to about 20 degrees in the positive or negative B direction.

In example embodiments, the prism 1105 may move the reflection surface 1107 in the third direction Z that is in parallel with the center axis 1106.

The OPFE 1110 may include optical lenses that are divided into m groups where m is a positive integer. The m lens group may move in the second direction Y to change an optical zoom ratio of the camera device 1100*b*. For example, the optical zoom ratio may be changed in a range of 3K, 5K, etc., by moving the m lens group, when K is a basic optical zoom ratio of the camera device 1100*b*.

The actuator 1130 may move the OPFE 1110 or the optical lens to a specific position. For example, the actuator 1130 may adjust the position of the optical lens for accurate sensing such that an image sensor 1142 may be located at a position corresponding to a focal length of the optical lens.

The image sensing device 1140 may include the image sensor 1142, a control logic 1144 and a memory 1146. The image sensor 1142 may be substantially the same as or similar to that of FIG. 5 or FIG. 13, and may capture or sense an image using the light L provided through the optical lens. The control logic 1144 may control overall operations of the camera device 1100*b*. For example, the control logic 1144 may provide control signals through control signal line CSLb to control the operation of the camera device 1100*b*.

The memory 1146 may store information such as calibration data 1147 for the operation of the camera device 1100*b*. For example, the calibration data 1147 may include information for generation of image data based on the provided light L, such as information on the above-described rotation angle, a focal length, an optical axis, etc. When the camera device 1100*b* is implemented as a multi-state camera having a variable focal length depending on the position of the optical lens, the calibration data 1147 may include multiple focal length values and auto-focusing values corresponding to the multiple states.

The storage device 1150 may store the image data sensed via the image sensor 1142. The storage device 1150 may be disposed at an outside of the image sensing device 1140, and may be stacked with a sensor chip including the image sensing device 1140. The storage device 1150 may be implemented with an electrically erasable programmable read-only memory (EEPROM), but embodiments are not limited thereto.

Referring to FIGS. 14 and 15, each of the camera devices 1100*a*, 1100*b* and 1100*c* may include the actuator 1130. Thus, the camera devices 1100*a*, 1100*b* and 1100*c* may include the same or different calibration data 1147 depending on the operations of the actuators 1130.

In example embodiments, one camera device 1100*b* may have a folded lens structure including the above-described prism 1105 and the OPFE 1110, and the other camera devices 1100*a* and 1100*b* may have a vertical structure without the prism 1105 and the OPFE 1110, however, embodiments are not limited thereto.

In example embodiments, one camera device 1100*c* may be a depth camera configured to measure distance information of an object using an infrared (IR) light. In this case, the application processor 1200 may merge the distance information provided from the depth camera 1100*c* and image data provided from the other camera devices 1100*a* and 1100*b* to generate a three-dimensional depth image.

In example embodiments, at least two camera devices, for example, the camera devices 1100*a* and 1100*b* among the camera devices 1100*a*, 1100*b* and 1100*c* may have different field of views, for example, through different optical lenses.

In example embodiments, the camera devices 1100*a*, 1100*b* and 1100*c* may be physically separated from each other. For example, the camera devices 1100*a*, 1100*b* and 1100*c* may each include a dedicated image sensor 1142.

The application processor 1200 may include an image processing device 1210, a memory controller 1220 and an internal memory 1230. The application processor 1200 may be separated from the camera devices 1100*a*, 1100*b* and 1100*c*. For example, the application processor 1200 may be implemented as one chip and the camera devices 1100*a*, 1100*b* and 1100*c* may implemented as another chip or other chips.

The image processing device 1210 may include a plurality of sub processors 1212*a*, 1212*b* and 1212*c*, an image generator 1214, and a camera device controller 1216.

The image data generated by the camera devices 1100*a*, 1100*b* and 1100*c* may be provided to the sub processors 1212*a*, 1212*b* and 1212*c* through distinct image signal lines ISLa, ISLb and ISLc, respectively. For example, image data generated from the camera device 1100*a* may be provided to the sub image processor 1212*a* through the image signal line LSLa, image data generated from the camera device 1100*b* may be provided to the sub image processor 1212*b* through the image signal line LSLb, and image data generated from the camera device 1100*c* may be provided to the sub image processor 1212*c* through the image signal line LSLc. The transfer of the image data may be performed using a camera serial interface (CSI) based on the mobile industry processor interface (MIPI), however, embodiments are not limited thereto.

In example embodiments, one sub processor may be assigned commonly to two or more camera devices. In this case, a multiplexer may be used to transfer the image data selectively from one of the camera devices to the shared sub processor.

The image data from the sub processors 1212*a*, 1212*b* and 1212*c* may be provided to the image generator 1214. The image generator 1214 may generate an output image using the image data from the sub processors 1212*a*, 1212*b* and 1212*c* according to image generating information or a mode signal.

For example, the image generator 1214 may merge at least a portion of the image data from the camera devices 1100*a*, 1100*b* and 1100*c* having the different fields of view to generate the output image according to the image generating information or the mode signal. In addition, the image generator 1214 may select, as the output image, one of the image data from the camera devices 1100*a*, 1100*b* and 1100*c* according to the image generating information or the mode signal.

In example embodiments, the image generating information may include a zoom factor or a zoom signal. In example embodiments, the mode signal may be a signal based on a selection of a user.

If the image generating information is the zoom factor and the camera devices 1100*a*, 1100*b* and 1100*c* have the different field of views, the image generator 1214 may perform different operations depending on the zoom signal. For example, when the zoom signal is a first signal, the image generator 1214 may merge the image data from the different camera devices to generate the output image. When the zoom signal is a second signal different from the first signal, the image generator 1214 may select, as the output image, one of image data from the camera devices 1100a, 1100b and 1100c.

In example embodiments, the image generator 1214 may receive the image data of different exposure times from the camera devices 1100a, 1100b and 1100c. In this case, the image generator 1214 may perform high dynamic range (HDR) processing with respect to the image data from the camera devices 1100a, 1100b and 1100c to generate the output image having the increased dynamic range.

The camera device controller 1216 may provide control signals to the camera devices 1100a, 1100b and 1100c. The control signals generated by the camera device controller 1216 may be provided to the camera devices 1100a, 1100b and 1100c through the distinct control signal lines CSLa, CSLb and CSLc, respectively.

In example embodiments, one of the camera devices 1100a, 1100b and 1100c may be designated as a master camera according to the image generating information of the mode signal, and the other camera devices may be designated as slave cameras. These data may be included in the control signal, and may be provided to corresponding camera devices 1100a, 1100b and 1100c through the distinct control signal lines CSLa, CSLb and CSLc.

The camera device acting as the master camera may be changed according to the zoom factor or an operation mode signal. For example, when the camera device 1100a has the wider field of view than the camera device 1100b and the zoom factor indicates a lower zoom magnification, the camera device 1100b may be designated as the master camera. When the camera device 1100a has the narrower field of view than the camera device 1100b and the zoom factor indicates a higher zoom magnification, the camera device 1100a may be designated as the master camera.

In example embodiments, the control signals provided from the camera device controller 1216 may include a sync enable signal. For example, when the camera device 1100b is the master camera and the camera devices 1100a and 1100c are the slave cameras, the camera device controller 1216 may provide the sync enable signal to the camera device 1100b. The camera device 1100b may generate a sync signal based on the provided sync enable signal and provide the sync signal to the camera devices 1100a and 1100c through a sync signal line SSL. As such, the camera devices 1100a, 1100b and 1100c may transfer the synchronized image data to the application processor 1200 based on the sync signal.

In example embodiments, the control signals provided from the camera device controller 1216 may include information on the operation mode. The camera devices 1100a, 1100b and 1100c may operate in a first operation mode or a second operation mode based on the information from the camera device controller 1216.

In the first operation mode, the camera devices 1100a, 1100b and 1100c may generate image signals with a first speed (e.g., a first frame rate) and encode the image signals with a second speed higher than the first speed (e.g., a second frame rate higher than the first frame rate) to transfer the encoded image signals to the application processor 1200. The second speed may be lower than thirty times the first speed. The application processor 1200 may store the encoded image signals in the internal memory 1230 or the external memory 1400. The application processor 1200 may read out and decode the encoded image signals to provide display data to a display device. For example, the sub processors 1212a, 1212b and 1212c may perform the decoding operation and the image generator 1214 may process the decoded image signals.

In the second operation mode, the camera devices 1100a, 1100b and 1100c may generate image signals with a third speed lower than the first speed (e.g., the third frame rate lower than the first frame rate) to transfer the generated image signals to the application processor 1200. For example, the image signals that are not encoded may be provided to the application processor 1200. The application processor 1200 may process the received image signals or store the received image signals in the internal memory 1230 or the external memory 1400.

The internal memory 1230 may be controlled by the memory controller 1220.

The PMIC 1300 may provide a power supply voltage to the camera devices 1100a, 1100b and 1100c, respectively. For example, the PMIC 1300 may provide, under control of the application processor 1200, a first power to the camera device 1100a through a power line PSLa, a second power to the camera device 1100b through a power line PSLb, and a third power to the camera device 1100c through a power line PSLc.

The PMIC 1300 may generate the power respectively corresponding to the camera devices 1100a, 1100b and 1100c and control power levels, in response to a power control signal PCON from the application processor 1200. The power control signal PCON may include information on the power depending on the operation modes of the camera devices 1100a, 1100b and 1100c. For example, the operation modes may include a low power mode in which the camera devices 1100a, 1100b and 1100c operate in low powers. The power levels of the camera devices 1100a, 1100b and 1100c may be the same as or different from each other. In addition, the power levels may be changed dynamically or adaptively.

While example embodiments have been described with reference to the figures, it will be understood by those of ordinary skill in the art that various changes in form and details may be made therein without departing from the spirit and scope as defined by the following claims and their equivalents.

What is claimed is:

1. An image sensor comprising:
   a light sensing element disposed in a substrate;
   a planarization layer disposed on the light sensing element;
   a color filter array layer disposed on the planarization layer, the color filter array layer comprising color filters;
   an interference blocking structure disposed between adjacent the color filters, the interference blocking structure at least partially overlapping the color filter array layer in a horizontal direction parallel to an upper surface of the substrate; and
   a microlens disposed on the color filter array layer,
   wherein the color filters comprise a green filter, a blue filter and a red filter,
   wherein a refractive index of the green filter is greater than 1.7 for a green light wavelength range of 500 nm to 570 nm,
   wherein the refractive index of the green filter corresponding to the green light wavelength range is greater than a refractive index of the microlens, and
   wherein the interference blocking structure includes a transparent material having a refractive index less than refractive indices of the color filters.

2. The image sensor of claim 1, wherein a refractive index of the red filter is greater than or equal to 1.8 for a red light wavelength range of 610 nm to 700 nm.

3. The image sensor of claim 2, wherein the refractive index of the red filter for the red light wavelength range is greater than that the refractive index of the microlens.

4. The image sensor of claim 1, wherein a thickness of the green filter in a vertical direction substantially perpendicular to the upper surface of the substrate is in a range of 2000 Å to 5000 Å.

5. The image sensor of claim 1, wherein a thickness of the red filter in a vertical direction substantially perpendicular to an upper surface of the substrate is in a range of 3000 Å to 6000 Å.

6. The image sensor of claim 5, wherein a thickness of the blue filter in the vertical direction substantially perpendicular to the upper surface of the substrate is in a range of 2000 Å to 5000 Å.

7. The image sensor of claim 1, wherein the green filter comprises a green pigment having a weight ratio of 35 wt % to 50 wt %.

8. The image sensor of claim 1, wherein the red filter comprises a green pigment having a weight ratio of 35 wt % to 55 wt %.

9. The image sensor of claim 1, wherein the blue filter comprises a green pigment having a weight ratio of 30 wt % to 45 wt %.

10. The image sensor of claim 1, wherein the color filters further comprises a white filter.

11. The image sensor of claim 1, wherein the interference blocking structure comprises a first interference blocking pattern and a second interference blocking pattern disposed in a vertical direction substantially perpendicular to the upper surface of the substrate, the first interference blocking pattern and the second interference blocking pattern including different materials from each other.

12. The image sensor of claim 11, wherein the first interference blocking pattern includes tungsten, and the second interference blocking pattern includes silicon oxide.

13. An image sensor comprising:
a light sensing element disposed in a substrate;
a planarization layer disposed on the light sensing element;

a color filter array layer disposed on the planarization layer, the color filter array layer comprising color filters; and
a microlens on the color filter array layer,
wherein the color filters comprise a green filter, a blue filter and a red filter, and
wherein the green filter comprises a green pigment having a weight ratio of 35 wt % to 50 wt %.

14. The image sensor of claim 13, wherein the green filter comprises the green pigment, a pigment dispersant, a binder resin, and a solvent.

15. An image sensor comprising:
a light sensing element;
a planarization layer disposed on the light sensing element;
a color filter array layer disposed on the planarization layer, the color filter array layer comprising color filters;
an interference blocking structure disposed between adjacent the color filters, the interference blocking structure at least partially overlapping the color filter array layer in a horizontal direction parallel to an upper surface of the planarization layer; and
a microlens on the color filter array layer,
wherein the color filters comprise a green filter, a blue filter and a red filter,
wherein a refractive index of the green filter for a green light wavelength range is greater than a refractive index of the microlens, a refractive index of the blue filter for a blue light wavelength range is greater than the refractive index of the microlens, and a refractive index of the red filter for a red light wavelength range is greater than the refractive index of the microlens, and
wherein the interference blocking structure includes a transparent material having a refractive index less than refractive indices of the color filters.

16. The image sensor of claim 15, wherein the refractive index of the green filter for the green light wavelength range is greater than 1.7.

17. The image sensor of claim 15, wherein the refractive index of the red filter for the red light wavelength range is greater than or equal to 1.8.

* * * * *